United States Patent
Kim

(10) Patent No.: US 7,896,563 B2
(45) Date of Patent: Mar. 1, 2011

(54) PHOTO SPINNER APPARATUS AND WAFER CARRIER LOADING/UNLOADING METHOD USING THE SAME

(75) Inventor: Yong-Su Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 235 days.

(21) Appl. No.: 12/318,732

(22) Filed: Jan. 7, 2009

(65) Prior Publication Data
US 2009/0180849 A1 Jul. 16, 2009

(30) Foreign Application Priority Data
Jan. 11, 2008 (KR) .................... 10-2008-0003290

(51) Int. Cl.
*G03D 5/00* (2006.01)
*B65H 1/00* (2006.01)
(52) U.S. Cl. ............... 396/611; 414/222.01; 414/937; 414/940
(58) Field of Classification Search ............. 396/611; 414/222.01, 411, 935, 937, 938, 939, 940
See application file for complete search history.

(56) References Cited

U.S. PATENT DOCUMENTS

| 6,042,324 | A | 3/2000 | Aggarwal et al. |
| 6,253,118 | B1* | 6/2001 | Koyama .................. 700/218 |
| 6,937,917 | B2* | 8/2005 | Akiyama et al. ........... 700/121 |
| 6,963,789 | B2* | 11/2005 | Bun et al. .................. 700/121 |
| 2005/0074313 | A1 | 4/2005 | Kang et al. |
| 2005/0274430 | A1 | 12/2005 | Yokoi et al. |

FOREIGN PATENT DOCUMENTS

KR 10-0572321 B 4/2006

* cited by examiner

*Primary Examiner*—Alan A Mathews
(74) *Attorney, Agent, or Firm*—Lee & Morse, P.C.

(57) ABSTRACT

A photo spinner apparatus, including a spin coater for coating a plurality of wafers with photoresist, a bake device for hardening the photoresist coated by the spin coater, a developer for developing the photoresist hardened in the bake device, a transfer unit for transferring the plurality of wafers between the developer, the bake device, and the spin coater, and an indexer including a wafer carrier loader to vertically stack a plurality of wafer carriers into which the plurality of wafers transferred by the transfer unit are loaded.

10 Claims, 5 Drawing Sheets

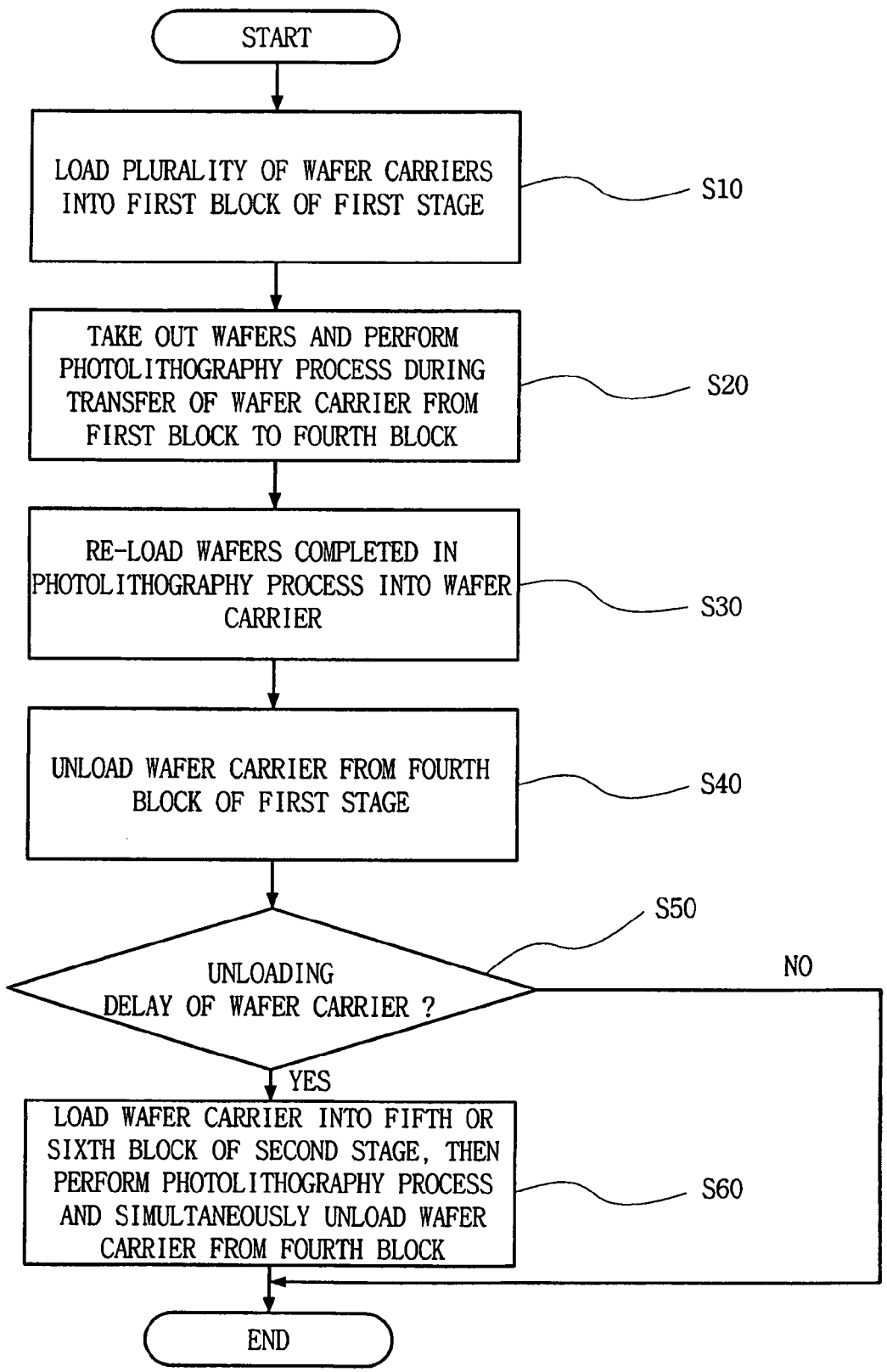

PHOTO SPINNER APPARATUS AND WAFER CARRIER LOADING/UNLOADING METHOD USING THE SAME

BACKGROUND

1. Technical Field

Embodiments relate to a photo spinner apparatus and wafer carrier loading/unloading method using the same.

2. Description of the Related Art

In general, semiconductor devices are manufactured in several steps, including repeated forming of semiconductor circuits on a wafer. These steps may include, e.g., growth and deposition process of layer material, coating of a photoresist, photolithography process for masking corresponding semiconductor circuits on the photoresist, etching process of removing a portion not corresponding to semiconductor circuits, and/or ion implantation of impurities in respective processes, etc. In the photolithography process a photo spinner apparatus is mainly used to apply and develop the photoresist.

In such photo spinner apparatus, a decrease in productivity may result when the loading/unloading time of wafer carrier by an automatic carrier device is too large. This causes the photolithography process equipment to sit idle, decreasing productivity.

Furthermore, about five wafer carriers may be horizontally arrayed by increasing the surface area of the wafer carrier loader. But, an increase in the surface area of the wafer carrier loader to handle larger wafers may result in a larger semiconductor production line, which may decrease productivity.

SUMMARY

Embodiments are therefore directed to a photo spinner apparatus and wafer carrier loading/unloading method using the same, which substantially overcome one or more of the problems due to the limitations and disadvantages of the related art.

It is therefore a feature of an embodiment to provide a photo spinner apparatus that is adapted to prevent idleness of the photolithography process.

At least one of the above and/or other features of an embodiment may be realized by providing a photo spinner apparatus, including a spin coater for coating a plurality of wafers with photoresist, a bake device for hardening the photoresist coated by the spin coater, a developer for developing the photoresist hardened in the bake device, a transfer unit for transferring the plurality of wafers between the developer, the bake device, and the spin coater, and an indexer including a wafer carrier loader to vertically stack a plurality of wafer carriers into which the plurality of wafers transferred by the transfer unit are loaded.

The wafer carrier loader may include a first stage supporting the plurality of wafer carriers at a first level, and a second stage supporting the plurality of wafer carriers at a second level corresponding to and above the first stage.

The first stage may include a first, second, third, and fourth blocks to horizontally support four wafer carriers.

The second stage may include a fifth and a sixth block to support the plurality of wafer carriers above the second and third blocks of the first stage.

The first block may be a loading port to load the wafer carrier, and the fourth block is an unloading port to unload the wafer carrier.

The first stage may include a horizontal move unit for horizontally moving the wafer carrier, and a plurality of guide bars for aligning the wafer carriers horizontally moving by the horizontal move unit.

The horizontal move unit may include a lifter for raising the wafer carrier supported by a corresponding block to a level over a height of the plurality of guide bars, and a conveyer for horizontally moving the wafer carrier raised to a level over a height of the guide bar through use of the lifter.

At least one of the above and/or other features of an embodiment may also be realized by providing a method of loading/unloading a wafer carrier in a photo spinner apparatus, the method including sequentially loading a plurality of wafer carriers into a first block of a first stage of a wafer carrier loader, moving the plurality of wafer carriers to a fourth block, passing through a first, second, and third block of the first stage, and taking out a plurality of wafers from the wafer carrier and performing a photolithography process on the wafers, loading the plurality of wafers completed in the photolithography process into the wafer carrier, unloading the wafer carrier into which the plurality of wafers have been again loaded, from the fourth block of the first stage, determining whether or not the wafer carrier has been unloaded; and if the wafer carrier is not unloaded from the fourth block of the first stage, loading another wafer carrier into which a plurality of wafers to undergo a photolithography process have been loaded, into a fifth or sixth block of a second stage, and thus continuously performing the photolithography process in the photo spinner apparatus.

The wafer carrier may not be unloaded from the fourth block when there is not an idle carrier device near the photo spinner apparatus or when there is a delay of the photolithography process in the photo spinner apparatus.

The method may further include taking out the plurality of wafers loaded in the another wafer carrier loaded on the fifth or sixth block of the second stage and then performing a photolithography process, and unloading the wafer carrier from the fourth block of the first stage.

BRIEF DESCRIPTION OF THE DRAWINGS

The above and other features and advantages will become more apparent to those of ordinary skill in the art by describing in detail exemplary embodiments with reference to the attached drawings, in which:

FIG. 5 illustrates a flow chart of a wafer carrier loading/unloading method in a photo spinner apparatus according to an embodiment.

DETAILED DESCRIPTION OF THE EMBODIMENTS

Figure 1:
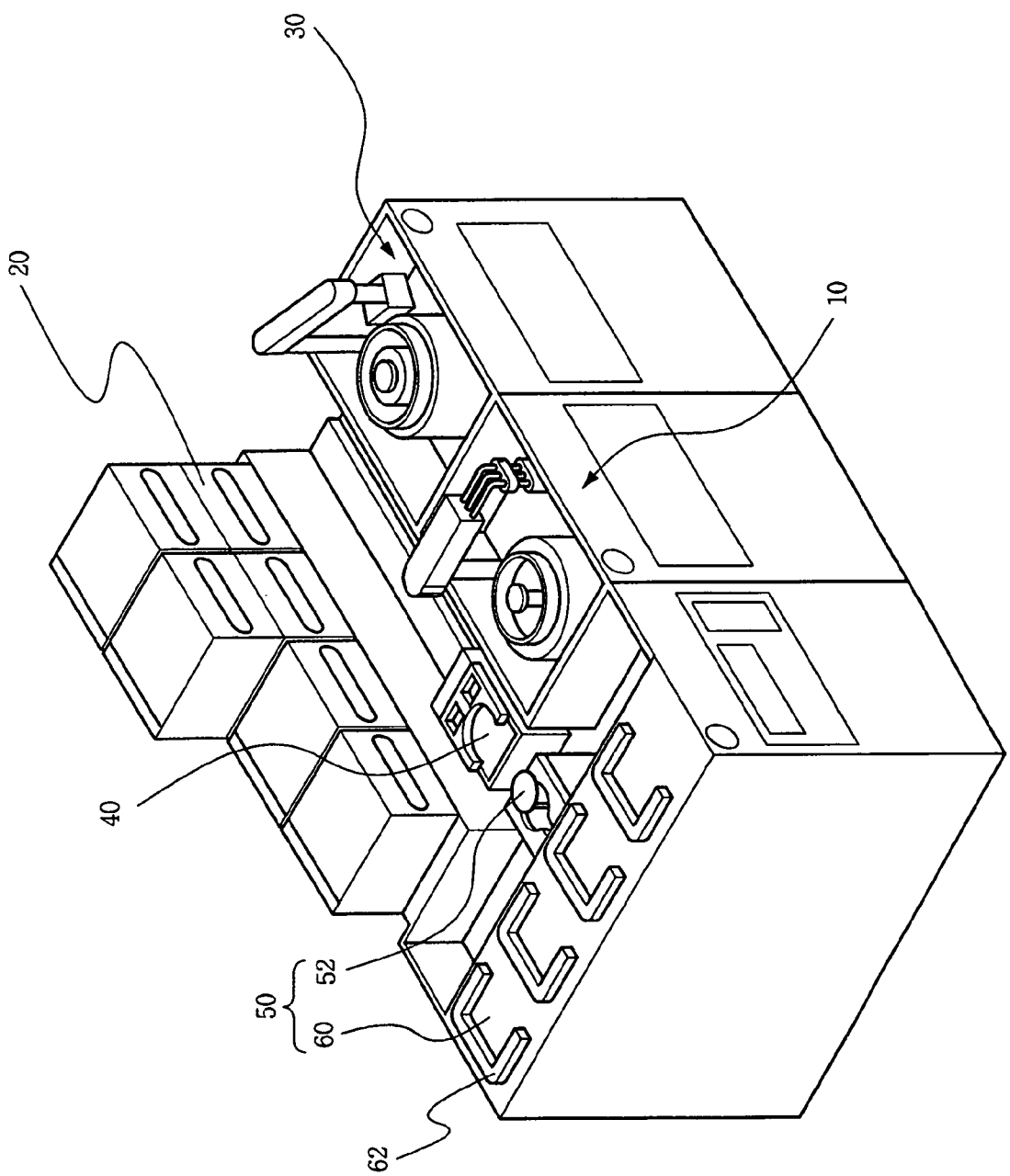
FIG. 1 illustrates a perspective view of a photo spinner according to an embodiment.

Korean Patent Application No. 10-2008-0003290, filed on Jan. 11, 2008, in the Korean Intellectual Property Office, and entitled: "Photo Spinner Apparatus and Wafer Carrier Loading/Unloading Method Therefore," is incorporated by reference herein in its entirety.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

A photo spinner apparatus of an embodiment is described below with reference to the accompanying drawings.

FIG. 1 illustrates a perspective view of a photo spinner apparatus according to an embodiment.

As shown in FIG. 1, a photo spinner apparatus may include a spin coater 10 for sequentially covering a plurality of wafers with photoresist, a bake device 20 for hardening the photoresist coated by the spin coater 10, an edge exposer 30 for photosensitizing the photoresist hardened on an edge portion of the wafer, a transfer unit 40 for transferring the plurality of wafers between the edge exposer 30, the bake device 20, and the spin coater 10, and an indexer 50 for loading the plurality of wafers transferred by the transfer unit 40 into a plurality of wafer carriers, and horizontally arraying the plurality of wafer carriers.

Though not shown in the drawing, the photo spinner may further include a developer for developing a photoresist corresponding to a pattern mask layer after forming a photoresist pattern layer in an exposing device installed adjacent to the photo spinner apparatus.

The indexer 50 may take out, one-by-one, wafers loaded in a plurality of wafer carriers, and transfer the wafers to the transfer unit 40. After processing, the indexer 50 may load the wafers that came out of the transfer unit 40 back into the wafer carriers. The indexer 50 may include a wafer carrier loader 60 for horizontally disposing the plurality of wafer carriers, and an index arm 52 for sequentially taking the wafers out of the plurality of wafer carriers positioned in the wafer carrier loader 60, or for storing the wafers therein. The plurality of wafer carriers may be loaded in the wafer carrier loader 60 by an automatic carrier device, e.g., OHT (Over-Head Transfer) conveyed along a rail installed on a ceiling of a semiconductor production line.

The wafer carrier loader 60 may include a flat surface horizontally supporting a plurality of wafer carriers, and a guide bar 62 for aligning the plurality of wafer carriers supported on the flat surface. The flat surface of the wafer carrier loader 60 may be adapted to support about four wafer carriers. Each wafer carrier may carry about 25 wafers. The photo spinner apparatus may perform a photolithography process on about 70 to 75 wafers at one time. Thus a plurality of processed wafers may be loaded in a corresponding wafer carrier, which may be simultaneously unloaded by the automatic carrier device. Then, a subsequent wafer carrier for a new photolithography process may be loaded.

Figure 2:
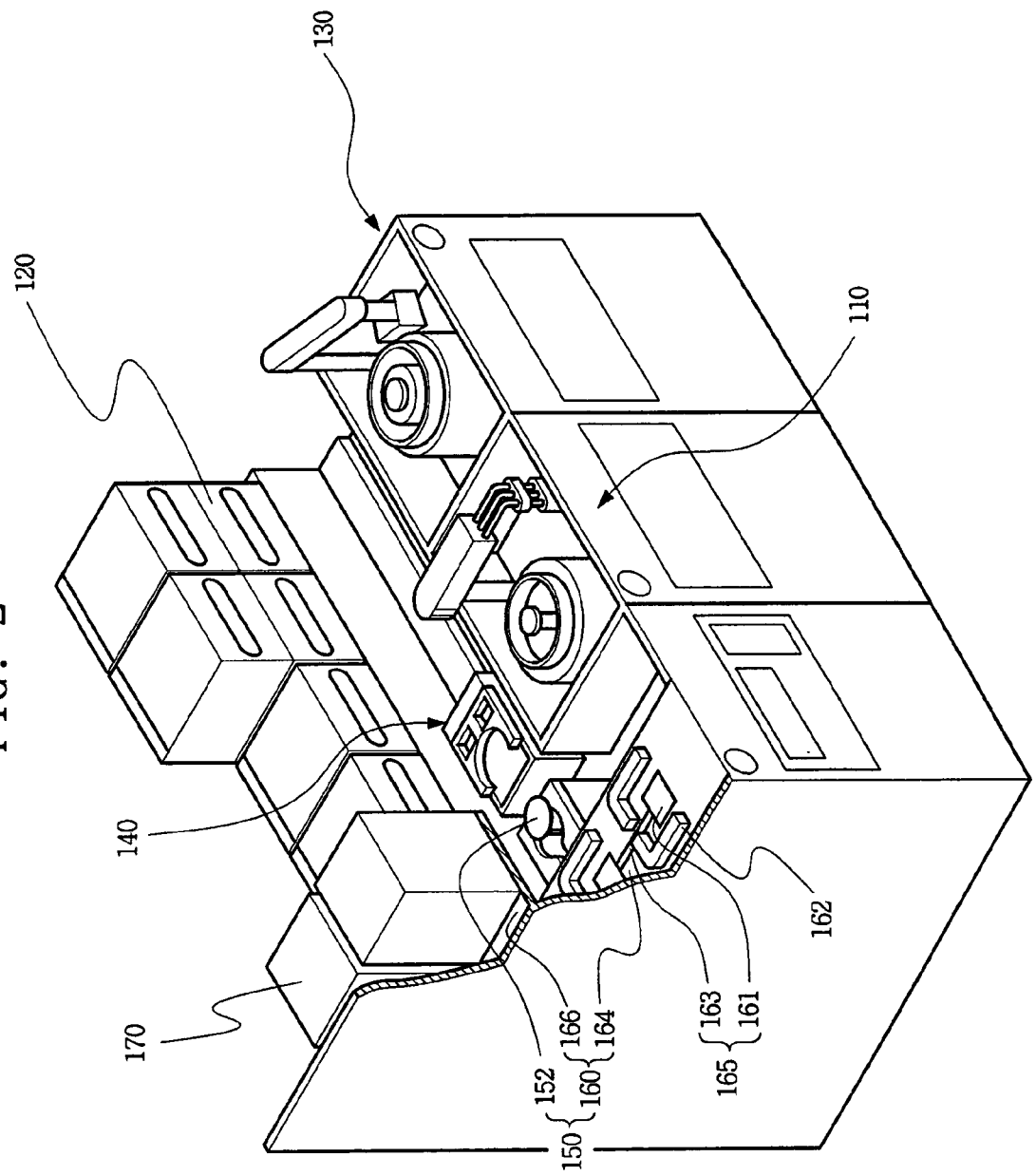
FIG. 2 illustrates a perspective view schematically showing a photo spinner apparatus according to an embodiment.
Figure 3:
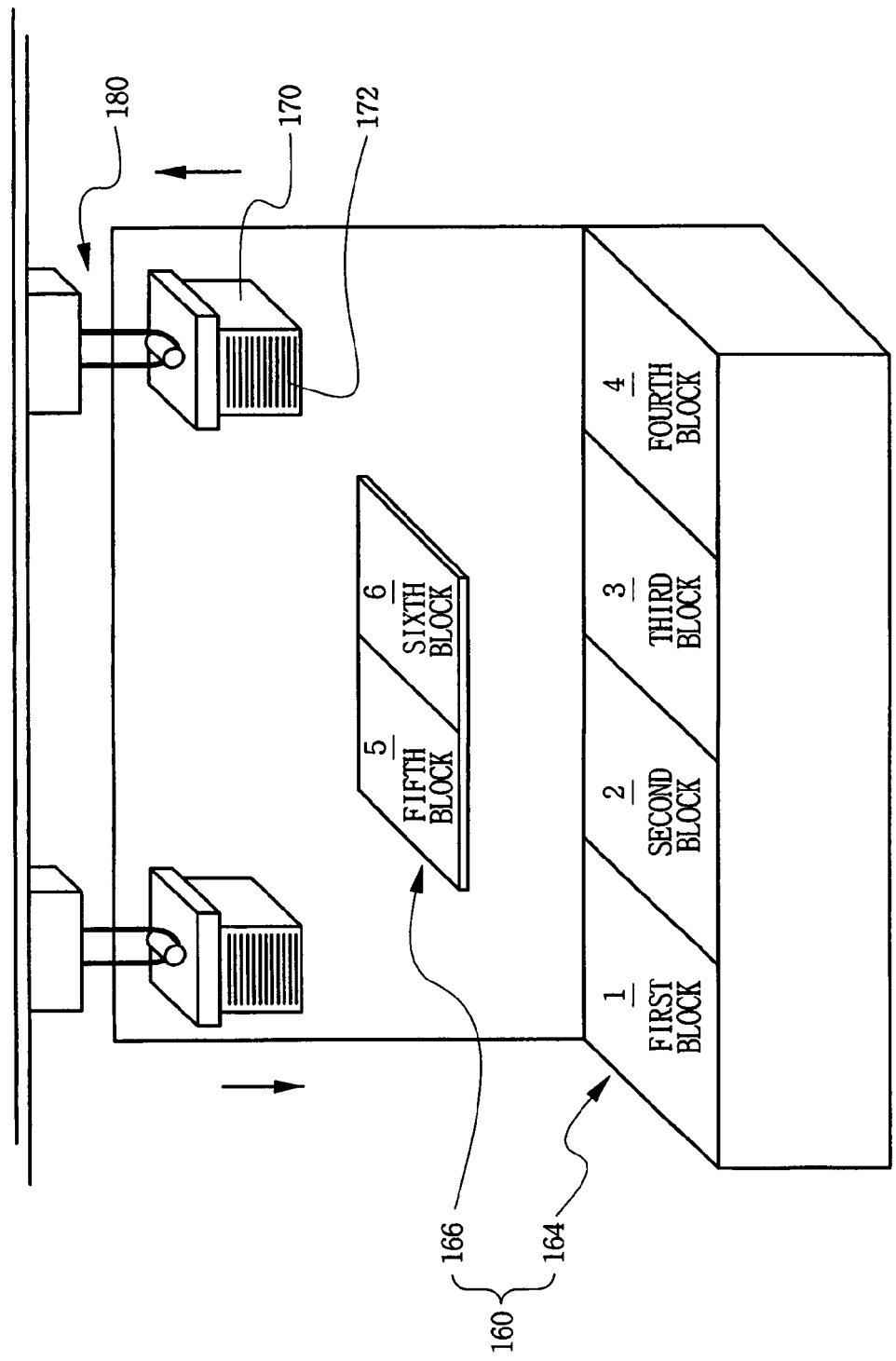
FIG. 3 illustrates the front of a wafer carrier loader and automatic carrier device of the embodiment in FIG. 2.

As shown in FIGS. 2 and 3, a photo spinner apparatus according to an embodiment may include a plurality of wafer carriers 170 loaded with a plurality of vertically-stacked wafers 172. The plurality of wafer carriers 170 may be supported by a first stage 164 and adapted to horizontally move on a first level. The plurality of wafer carriers may also be supported by a second stage 166 and adapted to horizontally move on a second level. The second stage may be at a second level higher than the first level of the first stage 164. The first and second stages 164 and 166 may be part of the wafer carrier loader 160.

The first stage 164 may support about four wafer carriers 170 and horizontally move the wafers. The second stage 166 may support about two wafer carriers 170. The wafer carrier 170 may carry about 25 wafers 172 therein. Thus, in a photo spinner apparatus in which about 70 to 75 wafers 172 may undergo a photolithography process, at least about two wafer carriers 170 may remain idle without a reduction in productivity.

Referring to FIG. 3, first and fourth blocks 1 and 4, disposed on opposite edges of the first stage 164, may be loading and unloading ports to vertically load and unload the wafer carriers 170 with an automatic carrier device, e.g., OHT moving along a rail formed on the ceiling of semiconductor production line. Fifth and sixth blocks 5 and 6 of the second stage 166 may be adapted to simply support the plurality of wafer carriers 170 at a central upper part of the first stage 164. The fifth and sixth blocks 5 and 6 may not be designated as a loading port or an unloading port. Therefore, the plurality of wafer carriers 170 supported by a center portion of the first stage 164 may be horizontally moved to an edge part of the first stage 164 and then may be unloaded by the automatic carrier device.

In the first stage 164, the wafer carrier 170 may be loaded on the first block 1 by the automatic carrier device. The wafer carrier 170 may be moved from the first block 1 to the fourth block 4 through second and third blocks 2 and 3. Then, the automatic carrier device may unload the wafer carrier 170 from the fourth block 4 of the first stage 164. The first stage 164 may include a horizontal move unit 165 for horizontally moving the wafer carrier 170, and a plurality of guide bars 162 for aligning the wafer carriers 170 on the first stage 164. The second stage 166 may also include a plurality of guide bars 162 for aligning the plurality of wafer carriers 170.

The horizontal move unit 165 may include a lifter 161 for raising the wafer carrier 170 supported by a corresponding block to a level over the height of the guide bar 162. The horizontal move unit 165 may also include a conveyor 163 for horizontally moving the wafer carrier 170 lifted by the lifter 161.

The photo spinner apparatus according to an embodiment may include the wafer carrier loader 160 that includes first and second stages 164 and 166 supporting a plurality of wafer carriers 170 in a vertically stacked structure. This configuration may prevent idleness of the photolithography process caused by a delay of the automatic carrier device, thereby substantially increasing productivity.

The plurality of wafers 172 loaded in the plurality of wafer carriers 170 supported by the wafer carrier loader 160 may be taken out sequentially by an index arm 152 and transferred to a transfer unit 140. Though not shown in the drawing, the plurality of wafers 172 taken out by the index arm 152 may be aligned in one direction on an alignment stage and may then be transferred to the transfer unit 140. The index arm 152 and the wafer carrier loader 160 may be provided as an indexer 150 for positioning the plurality of wafer carriers 170 and loading/unloading the plurality of wafers 172 in the wafer carriers 170.

The transfer unit 140 may be adapted to efficiently transfer a plurality of wafers 172. The transfer unit 140 may include a plurality of main arms individually supporting the wafers 172. The transfer unit 140 may be adapted to transfer the plurality of wafers 172 to a spin coater 110, bake device 120, edge exposer 130, and interface. The spin coater 110, bake device 120, edge exposer 130, and interface may be called a spinner unit. The spinner unit may be linked with the transfer unit 140 to perform a photolithography process of wafers 172.

The spin coater 110 may rotate each wafer 172 at a high speed, onto which a given amount of photoresist may be dropped and spread thereon with a given thickness through a concentric force. The spin coater 110 may rotate at a speed of about 2000 rpm for about 10 to about 20 seconds so that the photoresist may be applied thereon. An adsorbent of a given thickness may be applied thereon from the spin coater 110 to increase an adsorption force before the photoresist is applied. Photoresist has a relatively high viscosity and thus may be applied with a uniform thickness on an entire face of the wafer 172. The photoresist may be spread toward an edge while the wafer 172 rotates at a high speed after the photoresist is dropped onto a center of the wafer 172.

The bake device 120 may heat the wafer 172 to a given temperature and may harden the photoresist applied in the spin coater 110. The bake device 120 may gradually heat the wafer 172 from room temperature to about 200° C. to volatilize a thinner component that may remain in the photoresist, thereby hardening the photoresist. At this time, the photoresist applied onto the wafer 172 hardened by the bake device 120 may become thin as the thinner component is volatilized. In a soft bake process, photoresist applied by the spin coater 110 may be hardened by the bake device 120. Then, in a hard bake process, the photoresist applied onto wafer 172 completed in a subsequent exposure process of an exposure device may be hardened.

Although not shown in the drawing, additionally a cooling device may be disposed adjacent to the bake device 120. The cooling device may cool the wafer 172 back to room temperature after heating by the bake device 120.

Figure 4:
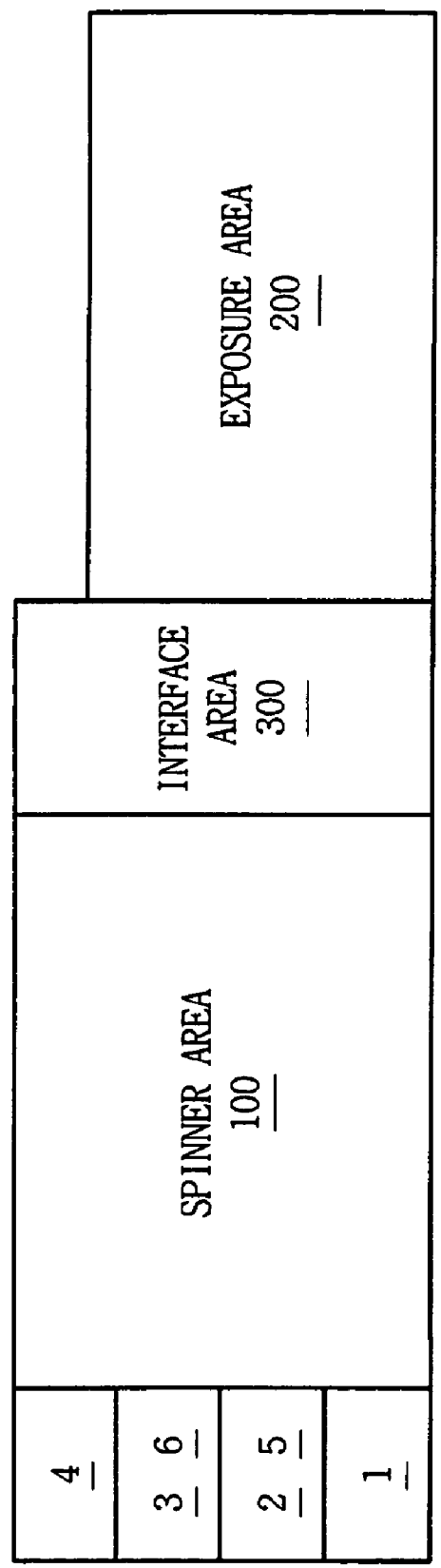
FIG. 4 illustrates installation areas of the photo spinner apparatus and exposure device illustrated in FIG. 2.

An interface may transfer the wafer 172, on which photoresist soft-bake processed in the bake device 120 has been formed, to an exposure device. After the exposure device is used in a subsequent process, the interface may receive the wafer 172 from the exposure device. The interface may be installed in an interface area 300 formed between spinner area 100 and exposure area 200 as shown in FIG. 4. The spinner area 100 may have the same or similar size to that of the wafer carrier loader 160, and corresponding to a size sufficient to horizontally array four wafer carriers 170 in which wafers 172 having a diameter of about 300 mm are loaded.

Thus, in a photo spinner apparatus according to an embodiment, the wafer carrier loader 160 may have a stacked structure of the first stage 164 and the second stage 166. The first stage 164 may be divided in a horizontal direction into first, second, third, and fourth blocks 1 to 4, and the second stage 166 may be divided into fifth and sixth blocks 5 and 6 above the first stage 164.

Further, the wafer carrier loader 160 having a stacked structure of the first and second stages 164 and 166 may be employed, thereby increasing the surface area to accommodate a larger diameter wafer 172 without unduly increasing the size of the semiconductor production line, thereby increasing productivity.

An exposure device may be classified as a stepper type for projecting a pattern corresponding to one chip size onto the entire lens, and a scanner type for gradually scanning a sectional face of chip corresponding to a diameter of lens in projecting the pattern. The production time of a photolithography process is decided by the exposure time in the exposure device. As the exposure process time of an exposure device is reduced, the transfer operation time should also be reduced, avoiding delay in loading/unloading operations of the wafer carrier 170 on the wafer carrier loader 160.

An edge exposer 130 may photosensitize photoresist formed on the edge of a wafer 172 to be developed in the developer. The edge exposer 130 may photosensitize photoresist formed on the edge of a wafer 172 before or after a hard or soft bake process.

Though not shown in the drawing, like the edge exposer 130, a wafer edge-rinsing device may be adapted to clean the photoresist along an edge of wafer 172 whose entire face may be covered with photoresist in the spin coater 110.

The developer may develop photoresist photosensitized in the exposure device and edge exposer 130, thus forming a specific pattern on the wafer 172. The developer may be adapted to develop photoresist on the wafer 172 by exposure to a developing solution, e.g., a mixture of deionized-water, ether, and surface active agent. The developing solution may dissolve photoresist that has been exposed to ultraviolet light. Thus, the developer may develop photoresist, e.g., by spraying a developing solution on a wafer 172 at a given pressure, or a dip scheme by putting a wafer 172 into a container filled with developing solution. A combined scheme of the spraying and dip schemes may be employed. When the developing is completed, the wafer 172 may be dried and then may again be loaded into the wafer carrier 170 by way of the indexer 150 and the transfer unit 140.

A wafer carrier loading/unloading method for use in a photo spinner apparatus according to an embodiment may be described as follows, with reference to the configuration described above.

FIG. 5 illustrates a flowchart providing a wafer carrier loading/unloading method in a photo spinner apparatus according to an embodiment.

As shown in FIG. 5, in a wafer carrier loading/unloading method according to an embodiment, a plurality of wafer carriers 170, in which a plurality of unprocessed wafers 172 are loaded, may sequentially be loaded in a first block 1 of a first stage 164 of the wafer carrier loader 160, in a step S10. An automatic carrier device may sequentially mount the plurality of wafer carriers 170 in the first block 1 of the first stage 164. A horizontal move unit 165 of the first stage 164 may sequentially move the plurality of wafer carriers 170 from the first block 1 to the fourth block 4, passing through second and third blocks 2 and 3.

While the plurality of wafer carriers 170 move from the first block 1 to the fourth block 4 through the second and third blocks 2 and 3 of the first stage 164, the plurality of wafers 172 may be taken out of the wafer carriers 170 to undergo a photolithography process, in a step S20. An index arm 152 may sequentially take the plurality of wafers 172 out of a plurality of wafer carriers 170 supported by the first stage 164 of a first level. A transfer unit 140 may move the plurality of wafers 172, taken out by the index arm 152, to a spin coater 110, a bake device 120, an edge exposer 130, an interface, and a developer in performing the photolithography process. The plurality of wafers 172 moved through the interface may undergo an exposure process in the exposure device. A wafer 172, finished with the exposure process, may be developed, dried, and then loaded in the wafer carrier 170. About 70 to 75 wafers 172 may undergo the photolithography process at once, moving through the spinner area 100, the interface area 300, and the exposure area 200 of a photolithography area.

A plurality of processed wafers 172 may again be loaded in the wafer carrier 170 moving to the fourth block 4, passing through the first to third blocks 1 to 3 of the first stage 164, in a step S30. The transfer unit 140 and the index arm 152 may again sequentially load the plurality of processed wafers 172 into the wafer carrier 170. When the plurality of processed wafers 172 are all again loaded into the corresponding wafer carrier 170, the wafer carrier 170 may horizontally move to the fourth block 4 of the first stage 164.

The wafer carrier 170 carrying the plurality of processed wafers 172, may be unloaded from the fourth block 4 of the first stage 164, in a step S40. Here, when the plurality of processed wafers 172 are again loaded in a corresponding wafer carrier 170, the automatic carrier device may remove the wafer carrier 170 from the wafer carrier loader 160 for a subsequent etching or cleaning process in a semiconductor manufacturing apparatus. The automatic carrier device may be controlled to first unload a wafer carrier 170 positioned near the photo spinner apparatus in the semiconductor production line.

When an automatic carrier device is busy transferring another wafer carrier 170 to the photo spinner apparatus, or there is no available automatic carrier device, the movement of wafer carriers 170 may not run smoothly. This may cause the photolithography process to be delayed in the photo spinner apparatus and it may therefore be difficult to smoothly unload a wafer carrier 170 with the automatic carrier device. For example, when the photolithography process, e.g., soft bake processing, hard bake processing, or developing, is partially delayed, the number of wafer carriers 170 standing by in the wafer carrier loader 160 may increase. It is determined in step S50 whether to unload the wafer carrier 170 carrying a plurality of processed wafers 172, from the fourth block 4 of the first stage 164 with the automatic carrier device.

When a wafer carrier 170 carrying a plurality of processed wafers 172 is not unloaded from the fourth block 4 of the first stage 164, a wafer carrier 172 carrying a plurality of unprocessed wafers 172 may be loaded into a fifth or sixth block 5 or 6 of the second stage 166, in a step S60. The automatic carrier device may load the wafer carrier 170 carrying unprocessed wafers on the fifth or sixth block 5 or 6 of the second stage 166 so that a subsequent photolithography process may be continuously performed. Accordingly, a wafer carrier loading/unloading method of a photo spinner apparatus according to an embodiment may provide a sufficient standby time of wafer carrier 170 by loading wafer carrier 170 in the second stage 166 even though there are a number of the plurality of wafer carriers 170 standing by in the first stage 164.

The plurality of wafers 172 mounted in a wafer carrier 170 loaded on the fifth or sixth block 5 or 6 of the second stage 166 may be taken out and may undergo a photolithography process. A wafer carrier 170 may then be unloaded from the fourth block 4 of the first stage 164. While the plurality of wafers 172 taken out of wafer carrier 170 on the second stage 166 undergo the photolithography process, a wafer carrier 170 may be unloaded from the fourth block 4 of the first stage 164 by using the automatic carrier device. Though not shown in the drawing, another wafer carrier 170 may be loaded in the first block 1 of the first stage 164, and then a subsequent photolithography process may be performed.

Accordingly, in a wafer carrier loading/unloading method of a photo spinner apparatus according to an embodiment, a plurality of wafer carriers 170 may be decentralized by being loaded and unloaded in and from first and second stages 164 and 166, thereby preventing idleness of the photolithography process caused by an unloading delay of an automatic carrier device or a process delay of the photo spinner apparatus and thus increasing productivity.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A photo spinner apparatus, comprising:
   a spin coater for coating a plurality of wafers with photoresist;
   a bake device for hardening the photoresist coated by the spin coater;
   a developer for developing the photoresist hardened in the bake device;
   a transfer unit for transferring the plurality of wafers between the developer, the bake device, and the spin coater; and
   an indexer including a wafer carrier loader to vertically stack a plurality of wafer carriers into which the plurality of wafers transferred by the transfer unit are loaded.

2. The apparatus as claimed in claim 1, wherein the wafer carrier loader includes a first stage supporting the plurality of wafer carriers at a first level, and a second stage supporting the plurality of wafer carriers at a second level corresponding to and above the first stage.

3. The apparatus as claimed in claim 2, wherein the first stage includes a first, second, third, and fourth blocks to horizontally support four wafer carriers.

4. The apparatus as claimed in claim 3, wherein the second stage includes a fifth and a sixth block to support the plurality of wafer carriers above the second and third blocks of the first stage.

5. The apparatus as claimed in claim 3, wherein the first block is a loading port to load the wafer carrier, and the fourth block is an unloading port to unload the wafer carrier.

6. The apparatus as claimed in claim 2, wherein the first stage includes a horizontal move unit for horizontally moving the wafer carrier, and a plurality of guide bars for aligning the wafer carriers horizontally moving by the horizontal move unit.

7. The apparatus as claimed in claim 6, wherein the horizontal move unit includes a lifter for raising the wafer carrier supported by a corresponding block to a level over a height of the plurality of guide bars, and a conveyer for horizontally moving the wafer carrier raised to a level over a height of the guide bar through use of the lifter.

8. A method of loading/unloading a wafer carrier in a photo spinner apparatus, the method comprising:
   sequentially loading a plurality of wafer carriers into a first block of a first stage of a wafer carrier loader;
   moving the plurality of wafer carriers to a fourth block, passing through a first, second, and third block of the first stage, and taking out a plurality of wafers from the wafer carrier and performing a photolithography process on the wafers;
   loading the plurality of wafers completed in the photolithography process into the wafer carrier;

unloading the wafer carrier into which the plurality of wafers have been again loaded, from the fourth block of the first stage;

determining whether or not the wafer carrier has been unloaded; and if the wafer carrier is not unloaded from the fourth block of the first stage, loading another wafer carrier into which a plurality of wafers to undergo a photolithography process have been loaded, into a fifth or sixth block of a second stage, and thus continuously performing the photolithography process in the photo spinner apparatus.

9. The method as claimed in claim 8, wherein the wafer carrier is not unloaded from the fourth block when there is not an idle carrier device near the photo spinner apparatus or when there is a delay of the photolithography process in the photo spinner apparatus.

10. The method as claimed in claim 8, further comprising taking out the plurality of wafers loaded in the another wafer carrier loaded on the fifth or sixth block of the second stage and then performing a photolithography process, and unloading the wafer carrier from the fourth block of the first stage.

* * * * *